United States Patent
Iizuka et al.

(10) Patent No.: US 7,535,026 B2
(45) Date of Patent: *May 19, 2009

(54) SEMICONDUCTOR LIGHT-EMITTING DEVICE WITH HIGH BRIGHTNESS AND LOW OPERATING VOLTAGE

(75) Inventors: Kazuyuki Iizuka, Tsuchiura (JP); Taichiroo Konno, Tsuchiura (JP); Masahiro Arai, Tsuchiura (JP)

(73) Assignee: Hitachi Cable, Ltd., Tokyo (JP)

(*) Notice: Subject to any disclaimer, the term of this patent is extended or adjusted under 35 U.S.C. 154(b) by 47 days.

This patent is subject to a terminal disclaimer.

(21) Appl. No.: 11/511,220

(22) Filed: Aug. 29, 2006

(65) Prior Publication Data

US 2007/0075328 A1    Apr. 5, 2007

(30) Foreign Application Priority Data

Sep. 30, 2005 (JP) ............... 2005-285938

(51) Int. Cl.
*H01L 33/00* (2006.01)

(52) U.S. Cl. ............... 257/79; 257/94; 257/96; 257/97

(58) Field of Classification Search ........ 257/94, 257/96–97, 101–103, E33.03, E33.032–E33.034, 257/E33.028, E33.025, 79, 80, 81

See application file for complete search history.

(56) References Cited

U.S. PATENT DOCUMENTS

| RE35,665 E | 11/1997 | Lin et al. |
| 6,057,562 A * | 5/2000 | Lee et al. ............ 257/96 |
| 6,797,986 B1 | 9/2004 | Kurahashi et al. |
| 7,368,759 B2 * | 5/2008 | Arai et al. ............ 257/103 |
| 2003/0052323 A1 * | 3/2003 | Takeuchi et al. ......... 257/81 |
| 2007/0075319 A1 * | 4/2007 | Konno et al. ............ 257/79 |

FOREIGN PATENT DOCUMENTS

| JP | 8-083927 A | 3/1996 |
| JP | 2001-068732 A | 3/2001 |
| JP | 2004-207682 A | 7/2004 |
| JP | 2005-136273 A | 5/2005 |
| JP | 2005-235802 A | 9/2005 |
| JP | 2005-268601 A | 9/2005 |
| WO | WO 2005/091384 | 9/2005 |

* cited by examiner

*Primary Examiner*—David Vu
*Assistant Examiner*—Brandon Fox
(74) *Attorney, Agent, or Firm*—Foley & Lardner LLP

(57) ABSTRACT

A semiconductor light-emitting device has a semiconductor substrate, an n-type cladding layer, an active layer, a p-type cladding layer, a p-type buffer layer, a p-type contact layer, and a current spreading layer. A part or all of the p-type buffer layer has a low Mg concentration buffer layer with a Mg concentration of $3.0 \times 10^{17}/cm^3$ or less and a film thickness of 50 nm or more.

9 Claims, 5 Drawing Sheets

SEMICONDUCTOR LIGHT-EMITTING DEVICE WITH HIGH BRIGHTNESS AND LOW OPERATING VOLTAGE

The present application is based on Japanese patent application No. 2005-285938, the entire contents of which are incorporated herein by reference.

BACKGROUND OF THE INVENTION

1. Field of the Invention

This invention relates to a semiconductor light-emitting device and, in particular, to a high-brightness semiconductor light-emitting device with a transparent conductive film of metal oxide to serve as a current spreading layer.

2. Description of the Related Art

In recent years, the crystalline quality of GaN-based or AlGaInP-based semiconductors is enhanced since they can be grown by a MOVPE (metalorganic vapor phase epitaxy) method. Thus, a high-brightness blue, green, orange, yellow, and red light-emitting diode (herein referred to as LED) as a semiconductor light-emitting device can be fabricated.

However, in order to offer the high brightness, the current spreading property needs to be improved such that a current is uniformly supplied into a chip plane of an LED. For example, an AlGaInP-based LED device is fabricated such that the current spreading layer has a thickness increased to about 5000 nm to 10000 nm. When using such a thick current spreading layer, diffusion of the dopant will occur since the heat history during the crystal growth becomes long, resulting in deterioration of the active layer. In addition, the current spreading layer needs to have a low resistivity to spread current. Thus, it needs to be doped at a high concentration. However, the high-concentration doping leads to lowering of the transparency of the current spreading layer. Further, the growth of the thick current spreading layer causes an increase in the manufacturing cost of the LED device. Thus, the LED device is difficult to fabricate at low cost.

In consideration of this, a method is proposed that an ITO (indium tin oxide) or ZnO (zinc oxide) film is used as the current spreading layer to offer a sufficient translucency and good current spreading characteristics (JP-A-8-83927). Further, a method is proposed that an ITO film is directly formed on a p-type clad layer (U.S. Reissued Patent No. 35665).

Thus, when the ITO film is used as the current spreading layer, the conventional 5000 nm to 10000 nm thick current spreading layer, i.e., the corresponding epitaxial layer is no longer needed to be grown, and as a result, the above-mentioned problems can be solved.

However, when using the ITO film as the current spreading layer, there is a typical problem that a contact resistance occurs between the semiconductor layer and the metal-oxide ITO film, thus causing an increase in forward operating voltage. As a solution to this problem, a method is proposed that LED is driven at a low voltage by providing a contact layer with a high carrier concentration of $1.0 \times 10^{19}/cm^3$ or more between the semiconductor layer and the ITO film so as to form a tunnel junction between the contact layer and the ITO film (for example, U.S. Reissued Patent No. 35665). However, semiconductor materials that can stably realize the contact layer with a high carrier concentration of $1.0 \times 10^{19}/cm^3$ or more are limited. According to the research results of the inventors regarding the contact layer, Zn-doped $Al_xGa_{1-x}As$ ($0 \leq X \leq 0.4$) is an optimal semiconductor that can stably provide the contact layer with a high carrier concentration of $1.0 \times 10^{19}/cm^3$ or more. However, since AlGaAs is not transparent to the emission wavelength, it needs to be formed into a thin film with a thickness of about 30 nm or less.

p-type dopants for AlGaInP-based compound semiconductors can be beryllium (Be), magnesium (Mg), zinc (Zn) and the like. Among these, Be materials used in molecular beam epitaxy (MBE) can be doped at a high concentration in a reduced diffusion but suffer from the drawback of being highly toxic. Zn is widely used as a p-type dopant for AlGaInP-based or AlGaAs-based compound semiconductors, but its diffusion constant is relatively large. Therefore, it is known that when doping Zn into the p-type cladding layer and the p-type buffer layer, the Zn is diffused into the active layer due to the heat history so that the brightness and reliability of the LED is lowered. Consequently, it is preferable to use, as the p-type dopant, Mg with a relatively smaller diffusion constant than Zn.

However, as previously mentioned, since the semiconductor to stably realize the contact layer with a high carrier concentration of $1.0 \times 10^{19}/cm^3$ or more is only Zn-doped $Al_xGa_{1-x}As$ ($0 \leq X \leq 0.4$), Zn needs to be used as the p-type dopant for the contact layer. However, even in the contact layer located at the uppermost layer with the least heat history during the growth, Zn in the contact layer is diffused easily by the heat history during the growth and cooling. The diffusion of Zn, the p-type dopant for the contact layer, causes the following two negative effects.

The first negative effect is to cause the lowering of output of the LED element. The diffused dopant creates concentration diffusion in the depth direction of the LED element and, after being diffused into the active layer of the the center of non-radiative recombination, thereby lowering the LED element, forms an impurity level in the active layer to be emission output.

The second negative effect is to increase the operating voltage of the LED element. The carrier concentration of the contact layer is decreased by the diffusion of Zn dopant from the contact layer, so that the tunnel junction between the contact layer and the ITO film becomes difficult to form, causing an increase in the tunnel voltage. Consequently the operating voltage of the LED element must be increased.

SUMMARY OF THE INVENTION

It is an object of the invention to provide a semiconductor light-emitting device that has a high brightness and low operating voltage, and that can suppress the reduction of emission output with time and the increase of the operating voltage.

(1) According to the invention, a semiconductor light-emitting device comprises:

a semiconductor substrate;

semiconductor layers formed on the semiconductor substrate, the semiconductor layers comprising an n-type cladding layer, an active layer, a p-type cladding layer, a p-type buffer layer, and a p-type contact layer; and a current spreading layer formed on the p-type contact layer, the current spreading layer comprising a metal-oxide material, wherein the active layer comprises $(Al_xGa_{1-x})_yIn_{1-y}P$ (where $0 \leq X \leq 1$, $0.4 \leq Y \leq 0.6$), the n-type cladding layer and the p-type cladding layer respectively comprise $(Al_xGa_{1-x})_yIn_{1-y}P$ (where $0.6 \leq X \leq 1$, $0.4 \leq Y \leq 0.6$), the p-type buffer layer comprises $Al_xGa_{1-x}As$ (where $0.45 \leq X \leq 1$), the p-type cladding layer and the p-type buffer layer comprise Mg as a main dopant, the p-type contact layer comprises Zn as a main dopant, and a part or all of the p-type buffer layer comprises a low Mg concentration buffer layer that comprises a Mg concentration of $3.0 \times 10^{17}/cm^3$ or less and a thickness of 50 nm or more.

The reason for selecting the above-mentioned materials as preferred materials to compose the above-mentioned active layer, n-type cladding layer, and p-type cladding layer depends strongly on the fact that they are optically transparent to a wavelength of light emitted from the active layer among the materials nearly lattice-matched to the semiconductor substrate. In addition, the reason for selecting $Al_xGa_{1-x}As$ ($0.45 \leq X \leq 1$) as the material to compose the p-type buffer layer is that it is transparent to the emission wavelength, lattice-matched to the semiconductor substrate, and is an inexpensive material that does not includes In materials with a high unit price.

The reason for having Zn as the main dopant in the p-type contact layer is that, although it has a drawback of having a relatively large diffusion constant, it is the best for obtaining a carrier concentration of $1.0 \times 10^{19}/cm^3$ or more. In addition, the reason for having Mg as the main dopant in the p-type cladding layer and the p-type buffer layer is that it can be added at a relatively high concentration and its diffusion constant is smaller than Zn. In order to prevent the dopant from diffusing into the active layer, Mg is used as a dopant near the active layer.

In addition, since the low Mg concentration buffer with an Mg concentration of $3.0 \times 10^{17}/cm^3$ or less and a thickness of 50 nm or more is inserted into a part of the p-type buffer layer, the diffusion of Zn in the direction of from the p-type contact layer to the active layer can be more effectively prevented (See FIG. 5).

Thus, the diffusion of Zn into the active layer can be sufficiently prevented by providing the low Mg concentration buffer layer partly in the p-type buffer layer. Alternatively, all of the p-type buffer layer may comprise the low Mg concentration buffer layer of $3.0 \times 10^{17}/cm^3$ or less, so that the diffusion of Zn into the active layer can be sufficiently prevented.

In the above invention (1), the following modifications and changes can be made.

(i) The low Mg concentration buffer layer is located within a range of 1,500 nm from an interface between the p-type buffer layer and the p-type contact layer.

In order to lower the tunnel voltage between the p-type contact layer and the ITO film by confining Zn with a high concentration in the p-type contact layer, it is more desired that the low Mg concentration buffer layer is inserted into a part near the p-type contact layer in the p-type buffer layer. For example, the low Mg concentration buffer layer is inserted at a position within 1,500 nm from the p-type contact layer, so that the Zn concentration in the p-type contact layer can be prevented from lowering, and the tunnel voltage between the p-type contact layer and the ITO film can be further reduced.

(ii) The low Mg concentration buffer layer and the p-type buffer layer are transparent to an emission wavelength, and the p-type buffer layer comprises a thickness of 200 nm or more and 5000 nm or less.

(iii) The low Mg concentration buffer layer comprises an undoped buffer layer.

(iv) The p-type contact layer comprises a Zn concentration of $1.0 \times 10^{19}/cm^3$ or more.

(v) The p-type contact layer comprises $Al_xGa_{1-x}As$ (where $0 \leq X \leq 0.4$) and a thickness of 1 nm or more and 30 nm or less.

(vi) The current spreading layer comprises ITO (indium tin oxide) and a carrier concentration of $8 \times 10^{20}/cm^3$ or more.

(vii) The semiconductor light-emitting device further comprises: a semiconductor reflective film comprising a pair of semiconductor layers different in refractive index between the semiconductor substrate and the n-type cladding layer.

(viii) The semiconductor reflective film comprises $(Al_xGa_{1-x})_yIn_{1-y}P$ (where $0 \leq X \leq 1$, $0.4 \leq Y \leq 0.6$) or $Al_xGa_{1-x}As$ (where $0 \leq X \leq 1$).

(ix) The current spreading layer comprises a thickness in a range of ±30% of d obtained by a relational expression: $d = A \times \lambda p/(4 \times n)$, where A is a constant of 1 or 3, $\lambda p$ is an emission wavelength (nm), and n is an refractive index.

<Advantages of the Invention>

In the invention, by providing the low Mg concentration buffer layer with a Mg concentration of $3.0 \times 10^{17}/cm^3$ or less and a thickness of 50 nm or more, the diffusion of Zn from the p-type contact layer is significantly suppressed. Therefore, a semiconductor light-emitting device can be provided that has a high brightness and low operating voltage, and that can suppress the reduction of emission output with time and the increase of the operating voltage.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Preferred embodiments of the present invention are explained hereinafter with reference to the drawings.

First Embodiment

Figure 1:
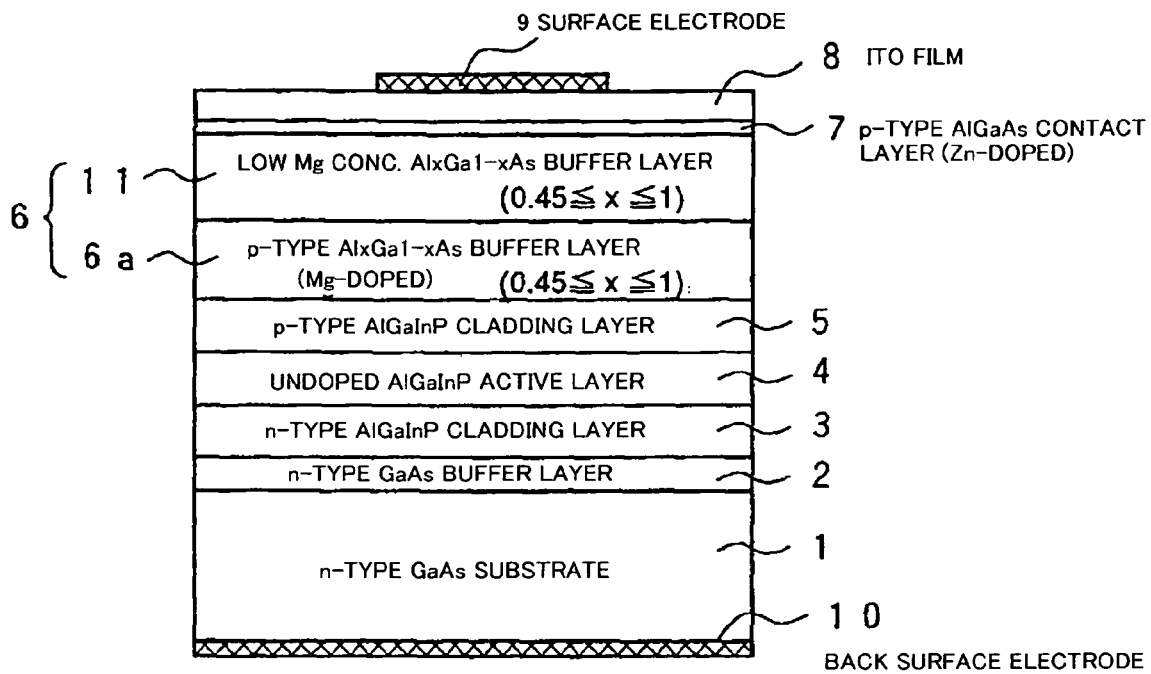
FIG. 1 is a schematic cross sectional view showing an AlGaInP-based red LED in a first preferred embodiment and Example 1 according to the invention.

FIG. 1 shows the construction of the light-emitting diode of the first preferred embodiment. In the light-emitting diode, a light-emitting portion comprises, sequentially grown on the n-type GaAs substrate 1 as a semiconductor substrate, a Si-doped n-type GaAs buffer layer 2, a Si-doped n-type AlGaInP cladding layer (also simply referred to as n-type cladding layer) 3, an undoped AlGaInP active layer (also simply referred to as active layer) 4, and a Mg-doped p-type AlGaInP cladding layer (also simply referred to as p-type cladding layer) 5. Further, on the top layer, the p-type cladding layer 5, a p-type AlGaAs contact layer (also simply referred to as p-type contact layer) 7 with Zn as a p-type dopant doped at a high concentration is formed. Furthermore, on the p-type contact layer 7, an ITO film 8, which is a transparent conductive film, is formed as a current spreading layer made of a metal-oxide material. Further, a surface electrode 9 is formed on the surface of the LED, and a back surface electrode 10 is formed on the rear surface of the LED.

The active layer 4 comprises $(Al_xGa_{1-x})_yIn_{1-y}P$ (where $0 \leq X \leq 1$, $0.4 \leq Y \leq 0.6$), the n-type cladding layer 3 and the p-type cladding layer 5 respectively comprise $(Al_xGa_{1-x})_yIn_{1-y}P$ (where $0.6 \leq X \leq 1$, $0.4 \leq Y \leq 0.6$).

The p-type contact layer 7 comprises $Al_xGa_{1-x}As$ ($0 \leq X \leq 0.4$) and a thickness of 1 nm or more and 30 nm or less, and Zn as a p-type dopant is doped thereinto at a high carrier concentration of $1.0 \times 10^{19}/cm^3$ or more.

The ITO film 8 as the current spreading layer has a thickness within a range of ±30% of d obtained by the relational expression: $d = A \times \lambda p/(4 \times n)$, where A is a constant of 1 or 3, $\lambda p$ is the emission wavelength (nm), and n is an refractive index. The ITO film 8 as the current spreading layer is formed by vacuum deposition or sputtering, and has a carrier concentration of $8 \times 10^{20}/cm^3$ or more just after the film formation.

The light-emitting diode is characterized by that a p-type buffer layer 6 comprising $Al_xGa_{1-x}As$ ($0.45 \leq X \leq 1$) with Mg doped as the main p-type dopant is formed between the p-type contact layer 7 and the p-type cladding layer 5. The p-type buffer layer 6 comprises a 50 nm or more-thick low Mg concentration buffer layer 11 formed therein. In other words, the p-type buffer layer 6 is composed of the low Mg concentration buffer layer 11 with a thickness of 50 nm or more and a residual p-type buffer layer 6a. The p-type buffer layer 6 has a thickness of 200 nm or more and 5000 nm or less, and the low Mg concentration buffer layer 11 has a Mg concentration of $3.0 \times 10^{17}/cm^3$ or less.

The low Mg concentration buffer layer 11 is located within 1500 nm from the interface between the p-type buffer layer 6 and the p-type contact layer 7, and the low Mg concentration buffer layer 11 and the p-type buffer layer 6a are transparent to the emission wavelength.

Figure 5:
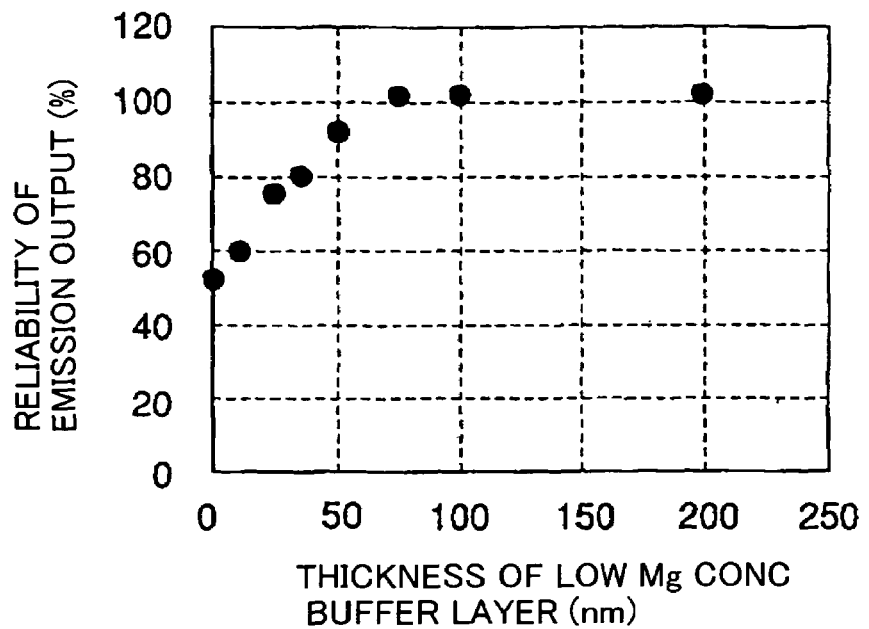
FIG. 5 is a diagram showing the relationship between a thickness of a low-Mg concentration buffer layer and an emission output after LED continuous current test relative to an initial emission output.

Thus, by inserting the low Mg concentration buffer 11 (with a Mg concentration of $3.0 \times 10^{17}/cm^3$ or less and a thickness of 50 nm or more) into the p-type buffer layer 6, the diffusion of Zn from the p-type contact layer 7 toward the active layer 4 can be effectively prevented (See FIG. 5). This effect can be also obtained by that the entire p-type buffer layer 6 comprises the low Mg concentration buffer layer 11 with a Mg concentration of $3.0 \times 10^{17}/cm^3$ or less.

Second Embodiment

Figure 2:
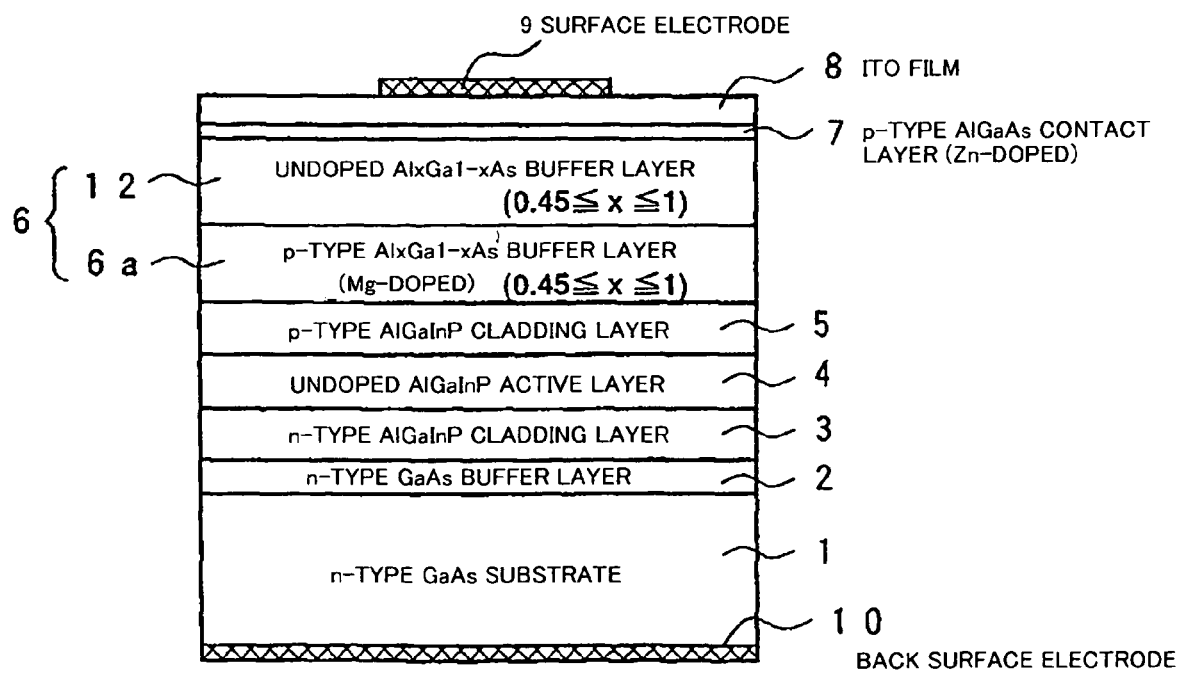
FIG. 2 is a schematic cross sectional view showing an AlGaInP-based red LED in a second preferred embodiment and Example 2 according to the invention.

FIG. 2 shows the second preferred embodiment that the low Mg concentration buffer layer 11 is undoped. As shown in FIG. 2, the undoped buffer layer 12 is formed with a thickness of 50 nm or more and within 1500 nm from the interface between the p-type buffer layer 6 and the p-type contact layer 7, and it is inserted into the p-type buffer layer 6. Therefore, in this embodiment, the diffusion of Zn from the p-type contact layer 7 to the active layer 4 can be sufficiently prevented as well. This effect can be also obtained by that the entire p-type buffer layer 6 comprises the undoped buffer layer 12.

Grounds for the Above Constructions and Values

The grounds for the above-mentioned constructions and values will be described below.

(1) First, in the case of the surface light-extracting type LED as employed in the embodiments, the p-type buffer layer 6 needs to be transparent to the emission wavelength. The other important needs are to be lattice-matched to the n-type GaAs substrate 1 and to be capable of being produced using an inexpensive material. From the above needs, it is preferable to use $Al_xGa_{1-x}As$ (where $0.45 \leq X \leq 1$) as the p-type buffer layer 6 that transmits red color light with a wavelength of around 630 nm, is lattice-matched to the n-type GaAs substrate 1, and does not contain the expensive In (indium) materials.

(2) Second, the p-type contact layer (ohmic contact layer) 7 contacting the current spreading layer of metal oxide, i.e., ITO film 8, needs to be doped with a conductivity-determining impurity at a very high concentration. Particularly, in the case of the Zn (zinc)-doped p-type contact layer 7, the crystal material is desirably GaAs or AlGaAs which has an Al ratio in the mixed crystal of 0 to 0.4, and has a carrier concentration of preferably $1 \times 10^{19}/cm^3$ or more, desirably as high as possible.

The ITO film 8 belongs generally to n-type semiconductor materials, and the LED is generally produced p-side up. For this reason, in the case of an LED using the ITO film 8 as the current spreading layer, the conductivity type is an n/p/n junction from the side of the substrate. As a result, a large potential barrier occurs in the LED, so that the LED must have typically a very high operating voltage. In order to solve this problem, the p-type contact layer 7 with a very high carrier concentration needs to be used as the p-type semiconductor layer. In addition, the reason for the narrow band gap of the p-type contact layer 7 depends strongly on the fact that it can easily increase the carrier concentration.

Furthermore, in conjunction with increasing the carrier concentration of the p-type contact layer 7, the carrier concentration of the ITO film 8 contacting the p-type contact layer 7 is also important to lower the tunnel voltage. Namely, for the same reason as the p-type contact layer 7, the ITO film 8 has preferably a carrier concentration as high as possible, for example, a carrier concentration of $8 \times 10^{20}/cm^3$ or more.

(3) Third, the p-type contact layer 7 has preferably a thickness of 1 nm to 30 nm. This is because the contact layer 7 has almost a band gap that allows the absorption of light emitted from the active layer 4, and, therefore, the emission output lowers as the thickness increases.

Figure 6:
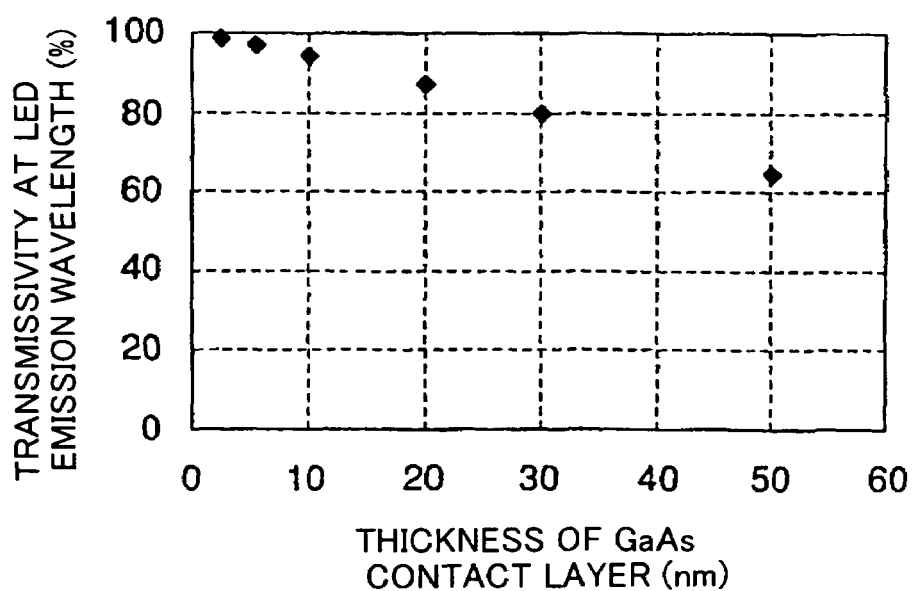
FIG. 6 is a diagram showing the relationship between a thickness of a contact layer and a transmissivity at an emission wavelength of the LED.

FIG. 6 is a diagram showing the relationship between a thickness of the contact layer 7 and a transmissivity at the emission wavelength of the LED. As shown in FIG. 6, the thickness of the contact layer 7 is preferably up to about 30 nm, more preferably up to 25 nm. If the thickness of the contact layer 7 is less than 1 nm, it becomes difficult to form the tunnel junction between the ITO film 8 and the p-type contact layer 7, and accordingly it becomes difficult to lower and stabilize the operating voltage. Thus, an optimal value for the thickness of the p-type contact layer 7 contacting the ITO film 8 is from 1 nm to 30 nm.

Figure 7:
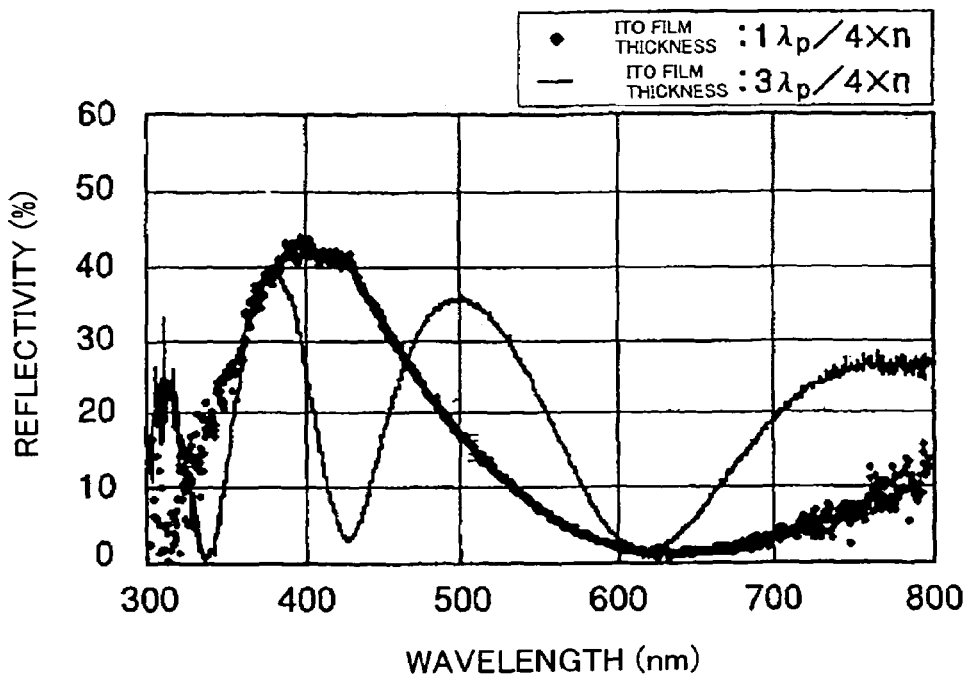
FIG. 7 is a diagram showing the reflectivity spectra of an ITO film formed on a GaAs substrate.

(4) Fourth, the thickness of the ITO film 8 is determined by the relational expression $d = A \times \lambda p/(4 \times n)$, where A is a constant of 1 or 3, $\lambda p$ is the emission wavelength (nm), and n is an refractive index. The ITO film 8 formed on the LED epitaxial wafer has a refractive index nearly intermediate between the semiconductor layer and the air layer, and it functions optically as an antireflection film. Therefore, in order to enhance the light extraction efficiency to obtain a higher emission-output LED element, the thickness is preferably designed based on the above-mentioned relational expression. In addition, the thickness of the ITO film 8 is preferably within the range of ±30% of 'd' obtained by the relational expression. This is because a wavelength band with an optically low reflectivity to serve as an antireflection film has a certain width. For example, tolerance in thickness of the antireflection film to have a reflectivity of 15% or less is in the range of ±30% of d calculated by the relational expression. If d exceeds ±30%, the effect of the antireflection film lowers and the emission output of the LED device lowers. In this regard, FIG. 7 shows the measurement result that, preparing a sample that the ITO film 8 is formed on the GaAs substrate 1, spectra of reflected light is measured when light is incident perpendicularly to this sample.

(5) Fifth, the thickness of the p-type buffer layer 6 inserted between the p-type contact layer 7 and the p-type cladding layer 5 is preferably 200 nm or more and 5000 nm or less. The reason for the lower limit, 200 nm or more, is that, if the distance from the active layer 4 to the surface electrode 9 is too short, the LED element may be broken by ultrasonic vibration etc. in the wire bonding process of the LED element fabrication. On the other hand, the reason for the upper limit, 5000 nm or less, is that the current spreading property of the LED element can be sufficiently obtained by the ITO film 8 formed on the contact layer 7. Namely, the buffer layer 6 is not always needed to have the current spreading property. If the buffer layer 6 is thickened about 10000 nm, the emission output of the LED element cannot be enhanced significantly since the current spreading effect of the ITO film 8 as described earlier is predominant. On the contrary, the fabrication cost of the LED element will be increased and the LED element must have an increased production cost. Accordingly, it is preferred that the buffer layer 6 has a thickness of about 200 nm to 5000 nm.

In this invention, the buffer layer 6 may have the same composition as the p-type cladding layer 5. Even in this case, it is preferred that the distance from the upper end of the active layer 4 to the lower end of the contact layer 7 is 1000 nm or more and 5000 nm or less.

EXAMPLES AND COMPARATIVE EXAMPLE

The invention will be further detailed below in Examples 1-2 and Comparative Example.

Example 1

An LED element (=semiconductor light-emitting device), wherein the low Mg concentration buffer layer 11 with a Mg concentration of $3.0 \times 10^{17}/cm^3$ or less and a thickness of 50 nm or more is formed in the p-type buffer layer 6, will be explained below.

First, a red LED epitaxial wafer with a structure as shown in FIG. 1 and an emission wavelength of about 630 nm is fabricated. Its epitaxial growth method, epitaxial layer thickness, epitaxial layer structure, electrode formation method, and LED device fabrication method are as follows.

On the n-type GaAs substrate 1, by the MOVPE method, an n-type (Si-doped) GaAs buffer layer (with a thickness of 200 nm and a carrier concentration of $1 \times 10^{18}/cm^3$) 2, an n-type (Si-doped) $(Al_{0.7}Ga_{0.3})_{0.5}In_{0.5}P$ cladding layer (with a thickness of 400 nm and a carrier concentration of $1 \times 10^{18}/cm^3$) 3, an undoped $(Al_{0.1}Ga_{0.9})_{0.5}In_{0.5}P$ active layer (with a thickness of 900 nm) 4, a p-type (Mg-doped) $(Al_{0.7}Ga_{0.3})_{0.5}In_{0.5}P$ cladding layer (with a thickness of 400 nm and a carrier concentration of $1.2 \times 10^{18}/cm^3$) 5, a p-type (Mg-doped) $Al_{0.8}Ga_{0.2}As$ buffer layer (with a thickness of 3000 nm and a carrier concentration of $1 \times 10^{18}/cm^3$) 6a, a low Mg concentration p-type (Mg-doped) $Al_{0.8}Ga_{0.2}As$ buffer layer (with a thickness of 50 nm and a carrier concentration of $3.0 \times 10^{17}/cm^3$) 11, and a p-type (Zn-doped) $Al_{0.1}Ga_{0.9}As$ contact layer (with a thickness of 3 nm and a carrier concentration of $2.0 \times 10^{19}/cm^3$) 7 are sequentially grown.

The growth temperature for MOVPE growth is set at 650° C. for the n-type buffer layer 2 to the p-type buffer layer 6, and 550° C. for the p-type contact layer 7. The other growth conditions are 6,666 Pa (=50 Torr) in growth pressure, 0.3 to 1.0 nm/sec in growth rate of each layer, and approximately 200 in V/III rate. The V/III rate of the p-type buffer layer 6 is 50, and the V/III rate of the p-type contact layer 7 is 30. Herein, the V/III ratio is a ratio (quotient) obtained by a denominator, which is the number of moles of a group III material such as TMGa or TMAl, and a numerator, which is the number of moles of a group V material such as $AsH_3$ or $PH_3$.

Materials for MOVPE growth can be organic metals such as trimethylgallium (TMGa), triethylgallium (TEGa), trimethylaluminum (TMAl) and trimethylindium (TMIn), or hydride gases such as arsine ($AsH_3$) and phosphine ($PH_3$).

A dopant material for an n-type layer such as the n-type buffer layer 2 can be disilane ($Si_2H_6$). A dopant material for a conductivity-determining impurity of a p-type layer such as the p-type cladding layer 5 can be biscyclopentadienyl magnesium ($Cp_2Mg$). However, diethyl zinc (DEZn) is used only for the p-type contact layer 7.

Furthermore, a dopant material for a conductivity-determining impurity of an n-type layer can be also hydrogen selenide ($H_2Se$), monosilane ($SiH_4$), and diethyl tellurium (DETe).

In addition, after the LED epitaxial wafer is taken out from the MOVPE furnace, the ITO film 8 with a thickness of 270 nm is formed by the vacuum deposition method on the surface of the wafer, i.e., the upper surface side of the p-type contact layer 7. In this structure, the ITO film 8 composes the current spreading layer.

At this time, an evaluating glass substrate set in the same batch as for the deposition of the ITO film 8 is taken out and cut into a size enough for the Hall measurement, and the electric characteristics of only the ITO film 8 are evaluated. As a result, a carrier concentration is $1.09 \times 10^{21}/cm^3$, a mobility is 18.4 $cm^2$/Vs, and a resistivity is $2.88 \times 10^{-4}$ Ω·cm.

Then, the surface electrode 9 as a circular electrode with a diameter of 110 μm is provided in the form of a matrix on the upper surface of the epitaxial wafer by the vacuum deposition method by using tools or materials and process used for a general photolithography process such as a resist and a mask aligner. A liftoff method is used for the electrode formation after the deposition. The surface electrode 9 is formed sequentially by depositing Ni (nickel) and Au (gold) with thicknesses of 20 nm and 500 nm, respectively. Furthermore, on the entire bottom surface of the epitaxial wafer, the back surface electrode 10 is formed by the same vacuum deposition method. The back surface electrode 10 is formed sequentially by depositing AuGe (gold-germanium alloy), Ni (nickel), and Au (gold) with thicknesses of 60 nm, 10 nm, and 500 nm, respectively. Then, an alloy process to alloy the electrode is performed such that the electrode is heated at 400° C. in a nitrogen gas atmosphere for 5 minutes.

Then, the LED epitaxial wafer with the electrode formed as described above is cut by a dicer such that the circular surface electrode 9 is located at the center, so as to obtain an LED bear chip with a chip size of 300 μm square. Then, the LED bear chip is mounted (die-bonding) on a TO-18 stem. Then, the LED bear chip is wire-bonded to have the LED device.

Figure 4:
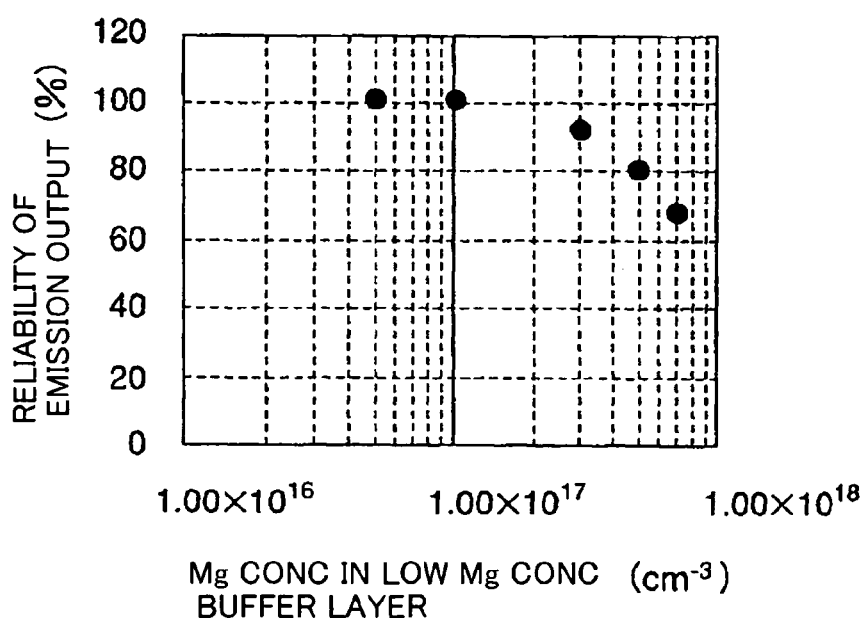
FIG. 4 is a diagram showing the relationship between a Mg concentration of a low-Mg concentration buffer layer and an emission output after an LED continuous current test relative to an initial emission output.

FIG. 4 is a diagram showing the relationship between a Mg concentration of the low-Mg concentration buffer layer and an emission output (i.e., relative value) after an LED continuous current test relative to an initial emission output. The horizontal axis in FIG. 4 shows the Mg concentration of the low Mg concentration buffer layer 11. As shown in FIG. 4, it is found that the relative values of emission output are increased when the Mg concentration of the low Mg concentration buffer layer 11 is $3.0 \times 10^{17}/cm^3$ or less.

FIG. 5 is a diagram showing the relationship between a thickness of the low-Mg concentration buffer layer and an emission output (i.e., relative value) after LED continuous current test relative to an initial emission output.

As shown in FIG. 5, it is found that the relative value of emission output is increased when the low Mg concentration buffer layer 11 is 50 nm or more. As a result, it is confirmed that the diffusion of Zn from the p-type contact layer 7 to the active layer 4 can be sufficiently prevented by inserting the low Mg concentration buffer layer 11 with a Mg concentration of $3.0 \times 10^{17}/cm^3$ or less and a thickness of 50 nm or more into at least a portion of the p-type buffer layer 6.

Example 2

Example 2 features that the low Mg concentration buffer layer 11 comprises an undoped buffer layer.

In Example 2, a red LED epitaxial wafer with a structure as shown in FIG. 2 and an emission wavelength of about 630 nm is fabricated. Its epitaxial growth method, epitaxial layer thickness, epitaxial layer structure, electrode formation method, and LED device fabrication method are basically the same as those in Example 1. The differences from Example 1 will be explained below.

As shown in FIG. 2, in Example 2, the p-type buffer layer 6 is divided into two layers, i.e., an undoped buffer layer 12 with a thickness of 1500 nm and a Mg-doped p-type buffer layer 6a with a thickness of 1500 nm. The undoped buffer layer 12 is formed to contact the growth surface, i.e., the contact layer 7. The composition of the undoped buffer layer 12 and the Mg-doped p-type buffer layer 6 and the carrier concentration of the Mg-doped buffer layer 6a are same as those of the p-type buffer layer 6 in Example 1.

The undoped buffer layer does not become a complete insulator, and is a p-type semiconductor in electrical property due to carbon etc. auto-doped during the growth. In this case, 'undoped' means that a dopant is not added positively, i.e., Cp$_2$Mg as a source material for Mg is not added.

Then, the LED epitaxial wafer thus fabricated is made into elements by the same process as used in Example 1.

The initial characteristics of the LED element thus fabricated are evaluated. As a result, the LED element can have excellent initial characteristics, i.e., an emission output of 1.12 mW and an operating voltage of 1.84 V, when feeding current at 20 mA (in evaluation).

Furthermore, the LED element is operated at a room temperature and at 50 mA, and a continuous current test thereof is performed for 168 hours (=1 week). As compared to those before the test, the LED element in Example 1 has excellent relative values, i.e., a relative emission output of 103% (provided that emission output before the current feeding is 100%), and a relative operation voltage of +0.004 V.

Figure 3:
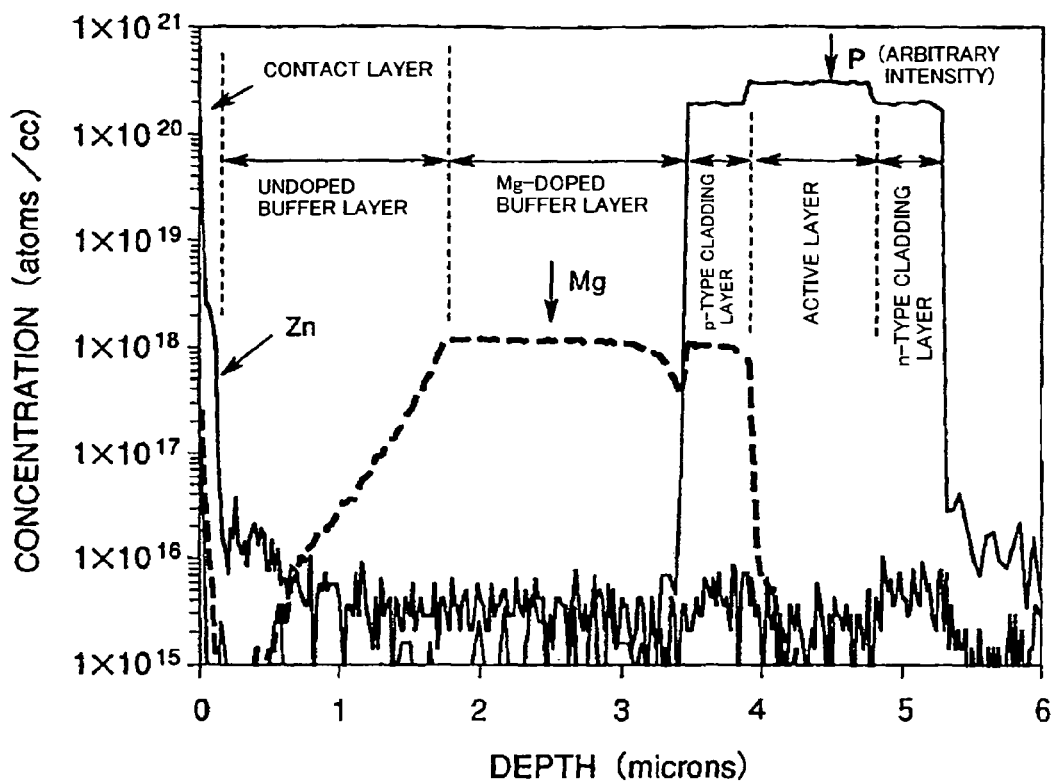
FIG. 3 is a SIMS analysis diagram of the AlGaInP-based red LED in Example 2 according to the invention.

FIG. 3 is a SIMS analysis diagram of the AlGaInP-based red LED in Example 2 according to the invention. The results of SIMS analysis are measured under conditions that the epitaxial wafer is polished by about 1500 nm in order to closely examine the area near the active layer 4.

Although Zn is diffused into the active layer 4 in Comparative Example described later (FIG. 9), in Example 2 (FIG. 3), the diffusion of Zn, the dopant in the p-type contact layer 7, is obviously prevented by the undoped buffer layer 12 to reduce the diffusion of Zn into the active layer 4. Therefore, it is assumed that, similarly to Example 1, the relative output of the LED after the continuous current test can be enhanced by preventing the diffusion of Zn into the active layer.

Furthermore, the LED in Example 2 has initial characteristics, i.e., emission output and operating voltage, better than those in Comparative Example. Regarding the improvement in the emission output, it is assumed that half of the p-type buffer layer 6 is replaced by the undoped buffer layer 12 and, therefore, the absorption effect by free carrier in the p-type buffer layer 6a is smaller than that in Comparative Example, so that the external quantum efficiency can be improved. Regarding the decrease in the operating voltage, it is assumed that the diffusion of Zn from the p-type contact layer 7 is prevented and, therefore, Zn can be confined at a higher concentration than Comparative Example in the p-type contact layer 7, so that the tunnel voltage between there and the ITO film 8 can be decreased.

In addition, when the entire p-type buffer layer 6 comprises the undoped buffer layer 12, the emission output is highest and the results after the continuous current test are also good. Thus, it is preferred that the entire p-type buffer layer 6 comprises the undoped buffer layer 12 in order to improve the emission output and completely prevent the diffusion of Zn from the p-type contact layer 7 into the active layer.

However, the diffusion of Zn from the p-type contact layer 7 into the active layer 4 can be sufficiently prevented by replacing a portion of the p-type buffer layer 6 with the undoped buffer layer 12.

Modifications of Examples 1 and 2

As explained above, in Examples 1 and 2, the tunnel voltage between the p-type contact layer 7 and the ITO film 8 can be reduced by confining Zn at a high concentration in the p-type contact layer 7. To enhance the effect, the undoped buffer layer 12 and the low Mg concentration buffer layer 11 are preferably inserted into a part near the p-type contact layer 7 in the p-type buffer layer 6. For example, by inserting them into a position within 1500 nm from the p-type contact layer 7, the tunnel voltage between the p-type contact layer 7 and the ITO film 8 can be further reduced while preventing the lowering of the Zn concentration in the p-type contact layer 7.

Although the undoped buffer layer 12 and the low Mg concentration buffer layer 11 to be inserted into the p-type buffer layer 6 may have a different composition from the p-type buffer layer 6, they comprise preferably a semiconductor material transparent to the emission wavelength in order to have a thickness of 50 nm or more.

In Examples 1 and 2, there is nothing to intervene between the active layer 4 and the n-type or p-type cladding layer 3 or 5. However, between there, an intrinsic undoped layer, a pseudo-undoped layer that can be simulated as an undoped layer even when containing slightly a conductivity type impurity, or a low carrier concentration cladding layer with relatively low concentration may be formed. As a result, the reliability in output of the LED element can be enhanced.

Although the low Mg concentration buffer layer 11 or undoped buffer layer 12 is formed in the p-type buffer layer 6 in Examples 1 and 2, the same low Mg concentration buffer layer 11 or undoped buffer layer 12 can be also formed in the p-type cladding layer 5, so that the diffusion of Zn from the p-type contact layer 7 to the active layer 4 can be prevented.

Although the active layer 4 comprises the undoped bulk layer in Examples 1 and 2, the intended effect of the invention can be obtained even when it comprises a multiquantum well or strained multiquantum well.

Although the red LED element with an emission wavelength of 630 nm is used in Examples 1 and 2, the other LED elements fabricated by using the same AlGaInP-based materials, for example, an LED element with an emission wavelength of 560 nm to 660 nm can be fabricated with no change in materials or carrier concentration of each layer used, particularly the window layer. Thus, even when it has a different wavelength band from Examples 1 and 2, the intended effect of the invention can be obtained.

Although the n-type cladding layer 3 is formed directly on the n-type buffer layer 2 in Examples 1 and 2, a DBR (distributed Bragg reflector), as a semiconductor reflective film, comprising a pair of semiconductor layers with a different refractive index can be formed between said n-type buffer layer 2 and said n-type cladding layer 3. In such case, the intended effect of the invention can be obtained as well.

Although the shape of the surface electrode 9 is always circular in Examples 1 and 2, it can be of another shape such as a square, a rhombus and a polygon. In such case, the intended effect of the invention can be obtained as well.

Although the semiconductor substrate comprises GaAs in Examples 1 and 2, the LED epitaxial wafer can be formed by a starting substrate of Ge and Si, or by a semiconductor substrate prepared such that a starting substrate of GaAs or Ge is removed later, and an alternative free-standing substrate of Si or a semiconductor with a higher thermal conductivity than Si. In such case, the intended effect of the invention can be obtained as well.

Comparative Example

[Comparative Example: Mg-doped AlGaAs with an Mg concentration of $1.0 \times 10^{18}/cm^3$]

Figure 8:
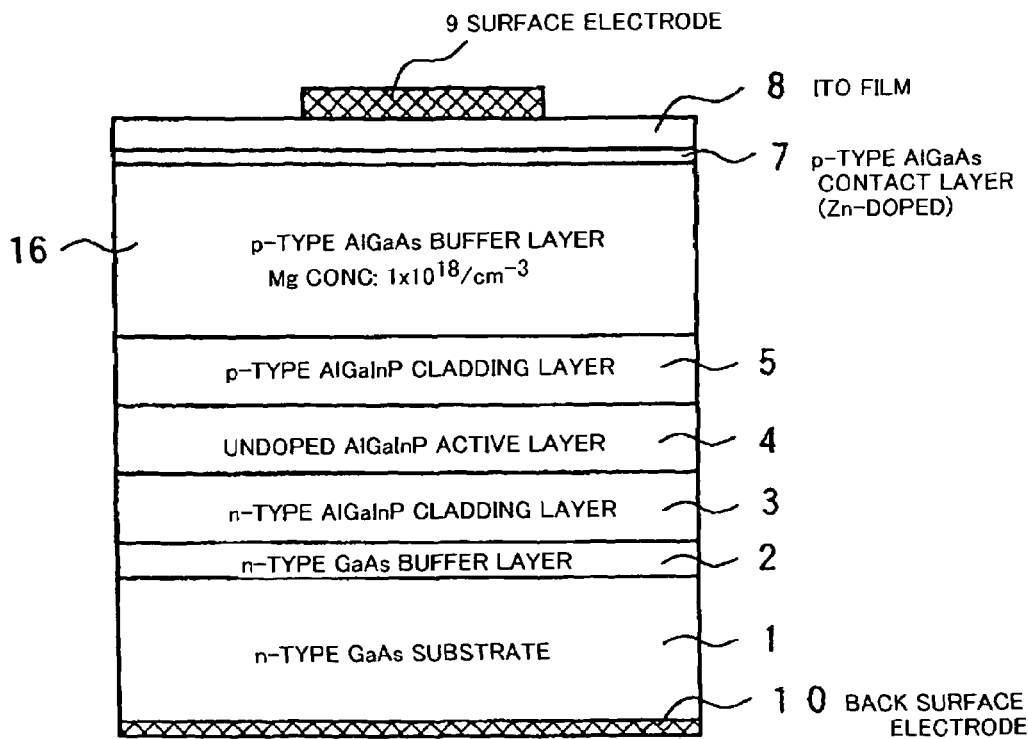
FIG. 8 is a schematic cross sectional view showing an AlGaInP-based red LED in Comparative Example.

As a comparative example, a red LED epitaxial wafer with an emission wavelength of about 630 nm structured as shown in FIG. 8 is prepared. Its epitaxial growth method, epitaxial layer thickness, epitaxial layer structure, electrode formation method, and LED device fabrication method are basically the same as those in Example 1. The differences from Example 1 will be explained below.

In Comparative Example, a p-type (Mg-doped) $Al_{0.8}Ga_{0.2}As$ buffer layer (with a thickness of 3000 nm and a carrier concentration of $1 \times 10^{18}/cm^3$) 16 is used as the buffer layer. The initial characteristics of an LED element thus fabricated are evaluated in the same way as Example 1. As a result, the LED element has, as the initial characteristics, an emission output of 0.95 mW and an operating voltage of 1.87 V when feeding current at 20 mA (in evaluation).

Furthermore, the LED element is operated at a normal humidity and at 50 mA, and a continuous current test thereof is performed for 168 hours (=1 week). As compared to those before the test, the LED element in Comparative Example has relative values, i.e., a relative emission output of 52% and a relative operation voltage of +0.06 V (about 3% increased).

Figure 9:
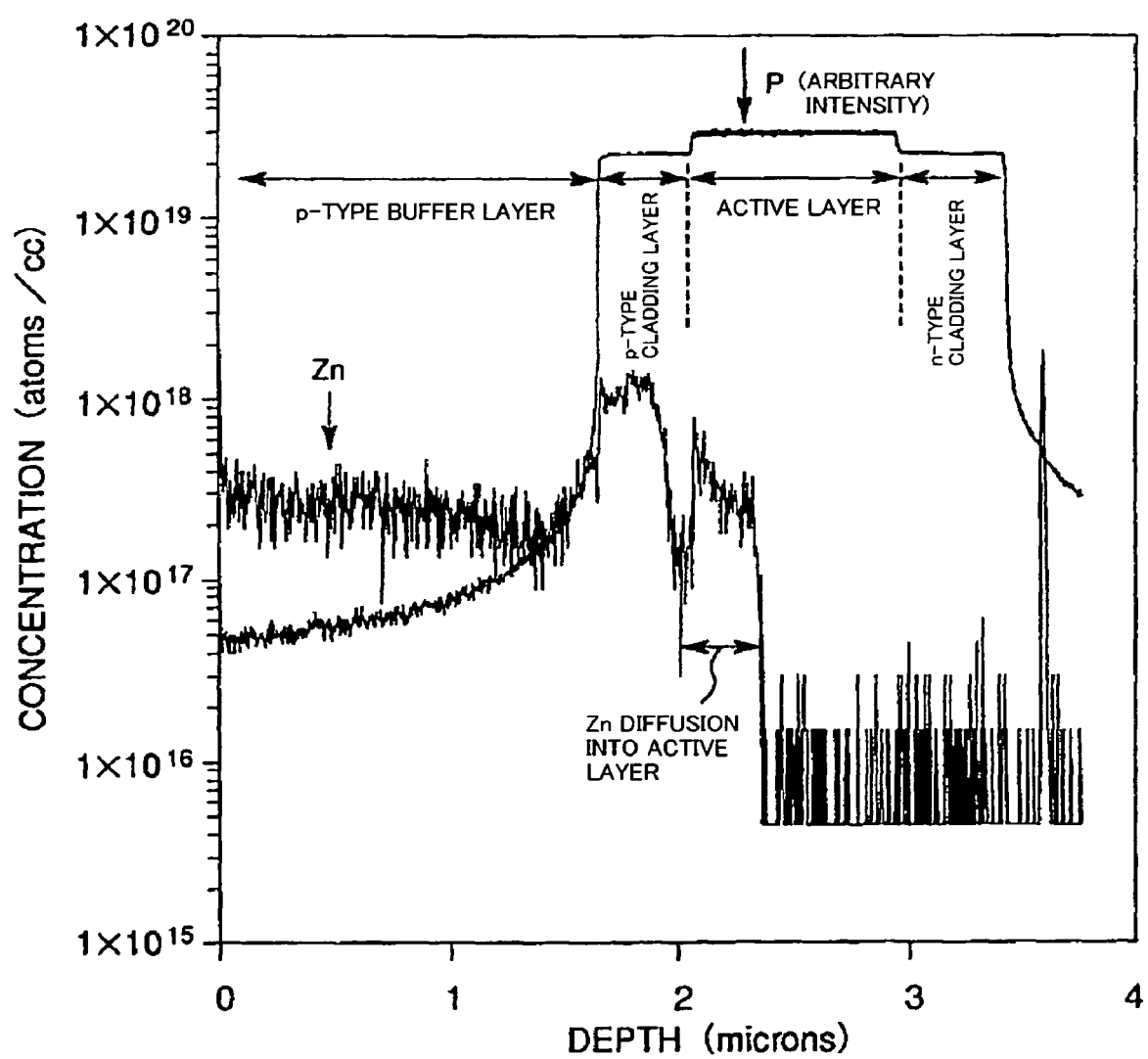
FIG. 9 is a SIMS analysis diagram of the AlGaInP red LED in Comparative Example.

FIG. 9 is a SIMS analysis diagram of the LED element after the continuous current test in Comparative Example. The results of SIMS analysis as shown in FIG. 9 are measured under conditions that the epitaxial wafer is polished by about 1500 nm in order to closely examine the area near the active layer 4. As a result, it is confirmed that Zn, the dopant in the p-type contact layer 7, is diffused and mixed into the active layer 4 in the LED element of Comparative Example after the continuous current test. This dopant diffusion causes the lowering of the life, i.e., the reliability in the LED element of Comparative Example.

The reason for this is assumed that the Zn-doped p-type contact layer 7 and Mg-doped p-type buffer layer 16 are in contact with each other, and the diffusion of Zn is promoted due to the interdiffusion of Zn and Mg, causing Zn to diffuse into the active layer 4.

In contrast, in Examples 1 and 2, this problem is solved by inserting the undoped buffer layer 12 or Mg buffer layer 11 with a Mg concentration of $3.0 \times 10^{17}/cm^3$ or less and a thickness of 50 nm or more between the Zn-doped layer and Mg-doped layer, i.e., between the Zn-doped p-type contact layer 7 and the Mg-doped p-type buffer layer 6.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light-emitting device, comprising:
   a semiconductor substrate;
   semiconductor layers formed on the semiconductor substrate, the semiconductor layers comprising an n-type cladding layer, an active layer, a p-type cladding layer, a p-type buffer layer, and a p-type contact layer; and
   a current spreading layer formed on the p-type contact layer, the current spreading layer comprising a metal-oxide material,
   wherein the active layer comprises $(Al_{x1}Ga_{1-x1})_{y1}In_{1-y1}P$ (where $0 \leq X1 \leq 1$, $0.4 \leq Y1 \leq 0.6$,
   the n-type cladding layer and the p-type cladding layer respectively comprise $(Al_{x2}Ga_{1-x2})_{y2}In_{1-y2}P$ (where $0.6 \leq X2 \leq 1$, $0.4 \leq Y2 \leq 0.6$),
   the p-type buffer layer comprises $Al_{x3}Ga_{1-x3}As$ (where $0.45 \leq X3 \leq 1$),
   the p-type cladding layer and the p-type buffer layer comprise Mg as a main dopant,
   the p-type contact layer comprises Zn as a main dopant, and
   a part or all of the p-type buffer layer comprises Mg-doped buffer layer and an undoped layer, the undoped buffer layer being provided at a side of the p-type contact layer.

2. The semiconductor light-emitting device according to claim 1, wherein:
   the undoped buffer layer is located within a range of 1,500 nm from an interface between the p-type buffer layer and the p-type contact layer.

3. The semiconductor light-emitting device according to claim 1, wherein:
   the undoped buffer layer and the p-type buffer layer are transparent to an emission wavelength, and the p-type buffer layer comprises a thickness of 200 nm or more and 5000 nm or less.

4. The semiconductor light-emitting device according to claim 1, wherein:
   the p-type contact layer comprises a Zn concentration of $1.0 \times 10^{19}/cm^3$ or more.

5. The semiconductor light-emitting device according to claim 1, wherein:
   the p-type contact layer comprises $Al_{x4}Ga_{1-x4}As$ (where $0 \leq X4 \leq 0.4$) and a thickness of 1 nm or more and 30 nm or less.

6. The semiconductor light-emitting device according to claim 1, wherein:

the current spreading layer comprises ITO (indium tin oxide) and a carrier concentration of $8 \times 10^{20}/cm^3$ or more.

7. The semiconductor light-emitting device according to claim 1, further comprising:

a semiconductor reflective film comprising a pair of semiconductor layers different in refractive index between the semiconductor substrate and the n-type cladding layer.

8. The semiconductor light-emitting device according to claim 7, wherein:

the semiconductor reflective film comprises $(Al_{x5}Ga_{1-x5})_{y5}In_{1-y5}P$ ) where $0 \leq X5 \leq 1$, $0.4 \leq Y5 \leq 0.6$) or $Al_{x6}Ga_{1-x6}As$ (where $0 \leq X6 \leq 1$).

9. The semiconductor light-emitting device according to claim 1, wherein:

the current spreading layer comprises a thickness in a range of $\pm 30\%$ of d obtained by a relational expression: $d = A \times \lambda p/(4 \times n)$, where A is a constant of 1 or 3, $\lambda p$ is an emission wavelength (nm), and n is an refractive index.

* * * * *